United States Patent
Lee et al.

(10) Patent No.: US 7,102,433 B2
(45) Date of Patent: Sep. 5, 2006

(54) BOOSTING CIRCUIT

(75) Inventors: Jeong-won Lee, Sungnam (KR); Jae-jun Moon, Seoul (KR); Soo-jung Chang, Suwon (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 30 days.

(21) Appl. No.: 10/751,469

(22) Filed: Jan. 6, 2004

(65) Prior Publication Data

US 2004/0145412 A1    Jul. 29, 2004

(30) Foreign Application Priority Data

Jan. 23, 2003    (KR) .................... 10-2003-0004626

(51) Int. Cl.
*H03F 3/45*    (2006.01)
(52) U.S. Cl. .................. 330/253; 330/255; 330/257
(58) Field of Classification Search ............ 330/255, 330/252, 253, 261, 264, 265, 257
See application file for complete search history.

(56) References Cited

U.S. PATENT DOCUMENTS

| | | | | |
|---|---|---|---|---|
| 4,369,410 A | * | 1/1983 | Fenk ............................ | 330/254 |
| 5,412,309 A | * | 5/1995 | Ueunten ....................... | 323/316 |
| 5,592,124 A | * | 1/1997 | Mullins et al. .............. | 330/308 |
| 5,754,078 A | * | 5/1998 | Tamagawa ................... | 330/255 |
| 5,789,980 A | * | 8/1998 | Nagata et al. .............. | 330/253 |
| 6,208,208 B1 | * | 3/2001 | Komatsu et al. ............ | 330/255 |
| 6,339,318 B1 | * | 1/2002 | Tanaka ....................... | 323/313 |
| 6,377,121 B1 | * | 4/2002 | Giduturi ..................... | 330/253 |
| 6,392,485 B1 | * | 5/2002 | Doi et al. ................... | 330/253 |
| 6,566,952 B1 | * | 5/2003 | Allan ......................... | 330/255 |
| 6,812,781 B1 | * | 11/2004 | Tsuchiya .................... | 327/563 |
| 6,828,855 B1 | * | 12/2004 | Wang ......................... | 330/253 |

* cited by examiner

*Primary Examiner*—Linh Nguyen
(74) *Attorney, Agent, or Firm*—Sughrue Mion, PLLC

(57) ABSTRACT

A boosting circuit is disclosed. The boosting circuit includes an input circuit part for outputting a differential current proportional to input voltages; a bias circuit part for mirroring the differential current, and producing an inverted differential current that the differential current is inverted; and an output circuit part for adjusting magnitudes of the differential current and the inverted differential current based on a predetermined ratio of MOS transistors, respectively, adding the adjusted differential current and inverted differential current, and producing an output current in a push-pull form. Accordingly, the boosting circuit has a broad maximum differentiable frequency bandwidth, and facilitates the adjustments of differentiation characteristics of an output current. Further, an amount of output current of differentiation form is not affected by external factors such as voltages, processes, temperatures, and so on.

5 Claims, 5 Drawing Sheets

BOOSTING CIRCUIT

This application claims the priority of Korean Patent Application No. 2003-4626, filed on Jan. 23, 2003, in the Korean Intellectual Property Office, the disclosure of which is incorporated herein by reference in its entirety.

BACKGROUND OF THE INVENTION

1. Field of the Invention

The present invention relates to a boosting circuit, and more particularly, to a boosting circuit to be used for a high frequency equalizer without having the amount of boost affected by external factors of not only frequency operation characteristics, but also voltages, processes, temperatures, and so on.

2. Description of the Related Art

The boosting circuit for an equalizer employed in optical recording/reproducing devices or hard disk drives for compact disk (CD)/digital video disk (DVD) is required to output differential currents from input voltages, and to adjust the amount of boost without affecting group delay characteristics up to a high frequency bandwidth of about 100 MHz.

FIG. 1 is a view for illustrating a conventional boosting circuit. As shown in FIG. 1, the conventional boosting circuit is constructed with capacitors C1 and C2, resistors R1 and R2, an operational amplifier A1, and a transconductor Gm1. The operational amplifier A1 is a fully differential operational amplifier having two input terminals and two output terminals.

In such a circuit constructed as above, an input voltage $V_i$ is differentiated in a differentiation circuit constructed with the operational amplifier A1, capacitors C1 and C2, resistors R1 and R2 and converted into a current for output through the transconductor Gm1. If $R=R1=R2$ and $C=C1=C2$, the relationship between the input voltage $V_i$ and an output current $i_o(=i_{op}-i_{on})$ can be expressed in Equation 1 as follows:

$$i_o(s) = g_m RCsv_i(s), \quad \text{[Equation 1]}$$

wherein $g_m$ denotes a transconductance of the transconductor Gm1. Accordingly, the magnitude of output current $i_o$ can be adjusted by varying the transconductance $g_m$ of the transconductor Gm1.

However, such a boosting circuit is affected by external factors such as temperatures, voltages, processes, and so on, since the magnitude of output current $i_o$ is adjusted by varying the transconductance $g_m$. Therefore, there is a drawback in that an additional tuning circuit is needed to prevent such influences. Further, there exists a problem in that power consumption becomes high and frequency characteristics are deteriorated, since a two-stage process is needed to differentiate and then convert input voltages into currents.

FIG. 2 is a view for showing another conventional boosting circuit. The boosting circuit of FIG. 2 has capacitors C3 and C4, an operational amplifier A2, and NMOS transistors M1, M2, M3, M4, M5, and M6.

In such a circuit constructed as above, an input voltage $V_i$ is converted into a differential current through the operational amplifier A2 and the capacitors C3 and C4. If $C=C3=C4$, the relationship between the input voltage $V_i$ and an output current $i_o(=i_{op}-i_{on})$ can be expressed in Equation 2 as follows:

$$i_o(s) = kCsv_i(s), \quad \text{[Equation 2]}$$

wherein k denotes a size ratio, that is, Width(W)/Length(L), of NMOS transistors M1 and M2 or M4 and M5. Therefore, an amount of output current can be adjusted by using a size ratio of NMOS transistors.

In the boosting circuit of FIG. 2, an extra tuning circuit is not needed since the amount of output current is adjusted with the size ratio, k, of the MOS transistors, resulting in an advantage of directly converting an input voltage into a differential output current, compared to the boosting circuit of FIG. 1.

However, unlike the boosting circuit of FIG. 1, an output of an output amplifier constructed with the NMOS transistors M1 and M4, current sources $I_B$, and so on, is used as an input to the NMOS transistors, so that the input terminals of the operational amplifier A2 are formed with p-type elements, which causes a drawback in broadening bandwidth since the p-type elements have a small transconductance compared to the n-type elements. Further, the two-stage amplification structure formed with the operational amplifier A2, NMOS transistors M1 and M4, and current sources $I_B$ results in a drawback in that frequency compensation is needed for stability. Moreover, the DC bias currents $I_B$ to the NMOS transistors M1 and M4 are reflected in the NMOS transistors M2 and M5, which, as a drawback, require compensations at a bias stage connected to a rear stage of the differentiation circuit.

SUMMARY OF THE INVENTION

The present invention has been devised to solve the above problems, so it is an object of the present invention to provide a boosting circuit having a broader differentiable frequency bandwidth, facilitating differentiation characteristics adjustments, and preventing an amount of output current from being affected by external factors such as voltages, processes, temperatures, and so on.

In order to achieve the above object, a boosting circuit according to the present invention comprises an input circuit part for outputting a differential current proportional to input voltages; a bias circuit part for mirroring the differential current, inverting the differential current, and producing an inverted differential current; and an output circuit part for adjusting magnitudes of the differential current and the inverted differential current based on a predetermined size ratio of MOS transistors, respectively, adding the adjusted differential current and inverted differential current, and producing an output current in a push-pull form.

In an exemplary embodiment, the input circuit part includes a first differentiation circuit for inputting a reference voltage and a first input voltage, and outputting a first differential current; a second differentiation circuit for inputting the reference voltage and a second input voltage, and outputting a second differential current; and a current mirror circuit for mirroring the first and second differential currents.

In an exemplary embodiment, the first and second differentiation circuits are each a differentiation circuit having a fully differential operational amplifier, capacitors, and resistors, and the fully differential operational amplifier has input terminals formed with NPN bipolar transistors in the left to right symmetry.

In an exemplary embodiment, the bias circuit part mirrors the first differential current and produces a first inverted differential current wherein the first differential current is inverted, and mirrors the second differential current and produces a second inverted differential current wherein the second differential current is inverted.

Further, the output circuit part in an exemplary embodiment, includes a first output part for adjusting and adding the magnitudes of the first differential current and the second inverted differential current based on the predetermined size ratio of a first MOS transistor, respectively, and outputting a first output current; and a second output part for adjusting and adding the magnitudes of the second differential current and the first inverted differential current based on the predetermined size ratio of a second MOS transistor, respectively, and outputting a second output current, and the output current being produced by adding the first and second output currents.

BRIEF DESCRIPTION OF THE DRAWINGS

The invention will be described in detail with reference to the following drawings in which like reference numerals refer to like elements, and wherein.

DETAILED DESCRIPTION OF THE PREFERRED EMBODIMENT

Hereinafter, the present invention will be described in detail with reference to the accompanying drawings.

Figure 3:
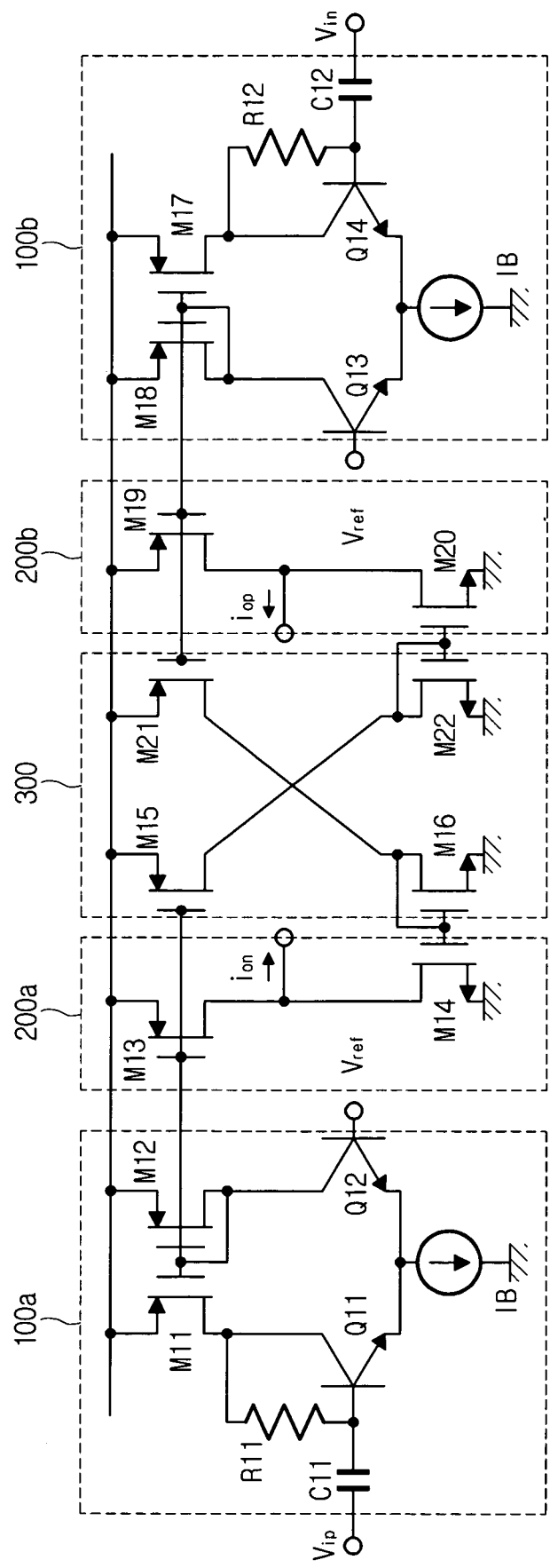
FIG. 3 is a view for showing a boosting circuit according to an embodiment of the present invention.

FIG. 3 is a view for showing a boosting circuit according to an embodiment of the present invention. The boosting circuit is structured with input circuit parts 100a and 100b, output circuit parts 200a and 200b, and a bias circuit part 300.

The input circuit parts 100a and 100b each outputs a differential current proportional to a differentiation of an input voltage. The bias circuit part 300 mirrors currents outputted from the input circuit parts 100a and 100b in order to reflect signals in the push-pull form, and produces inverted mirror currents. The output circuit parts 200a and 200b determine the magnitudes of the currents outputted from the input circuit parts 100a and 100b, and the bias circuit part 300 based on a size ratio of MOS transistors M13 and M15, that is, a ratio, k, of Width value(W)/Length value(L), add and output the magnitudes in the push-pull form.

The input circuit part 100a is constructed with a differential amplifier formed with first and second NPN transistors Q11 and Q12 in the left to right symmetry, a first differentiation circuit formed with a first capacitor C11 and a first resistor R11, and a current mirror circuit formed with PMOS transistors M11 and M12, and the input circuit part 100b is constructed with a differential amplifier formed with third and fourth transistors Q13 and Q14, a second differentiation circuit formed with a second capacitor C12 and a second resistor R12, and a current mirror circuit formed with PMOS transistors M17 and M18.

The first differentiation circuit uses $V_{ip}-V_{ref}$ as an input voltage, and the second differentiation circuit uses $V_{in}-V_{ref}$ as an input voltage.

A feedback configuration of the differential amplifier, first capacitor C11, and first resistor R11 in the first differentiation circuit converts collector currents of the first and second transistors Q11 and Q12 into differential currents of differential form proportional to a differentiation of the input voltage $V_{ip}-V_{ref}$. That is, a differential current corresponding to the input voltage $V_{ip}-V_{ref}$ flows in the first transistor Q11, and a current in the reverse direction of the differential current flows through the collector of the second transistor Q12. At this time, since the first resistor R11 determines the quality factor Q in frequency characteristics, it is possible to maintain the differential characteristics(+90°) for phase characteristics in the operation bandwidth, using the first resistor R11. Further, unlike the boosting circuit of FIG. 2, the frequency characteristics can be maximized by using NPN bipolar transistors for a single stage differential amplifier, and the stability characteristics can be easily secured without an additional frequency compensation circuit. The structure of the second differentiation circuit and the operation process are the same as those of the first differentiation circuit.

The bias circuit part 300 mirrors the differential currents flowing in the PMOS transistors M12 and M18 of the input circuit parts 100a and 100b by using the PMOS transistors M15 and M21, converts the differential currents into a form of bias voltages for the NMOS transistors M16 and M22, and then inverts the differential currents to produce inverted differential currents.

The output circuit parts 200a and 200b adjust the magnitudes of the differential currents produced from the input circuit parts 100a and 100b and the magnitudes of the inverted differential currents produced from the bias circuit part 300 with a size ratio k of the MOS transistors M13 and M15, which is added to produce a final output current in the push-pull form.

Figure 1:
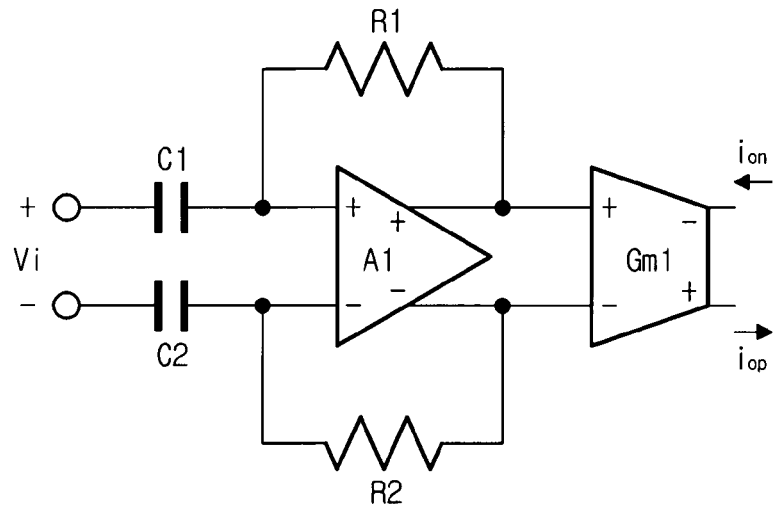
FIG. 1 and FIG. 2 are views for showing conventional boosting circuits, respectively.
Figure 2:
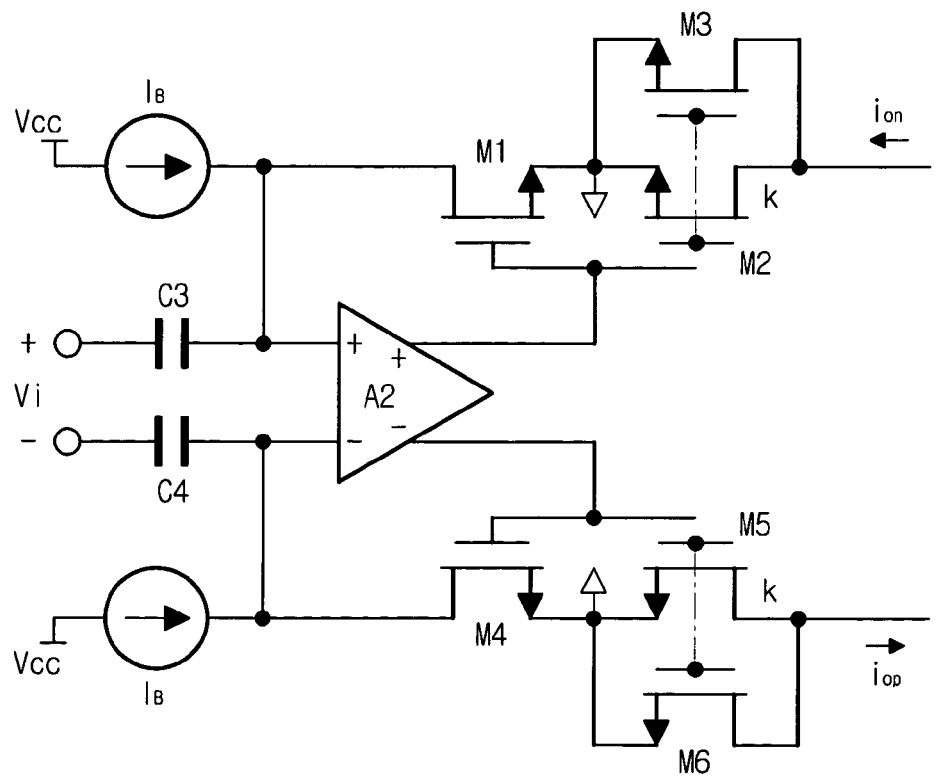

In the boosting circuit of FIG. 2, the capacitors C3 and C4 or the size ratio, k, of the MOS transistors are designed large according to Equation 2 in case that a basic output differential amount is small, which costs a frequency bandwidth. However, in the boosting circuit of the present invention, an output twice as large can be basically obtained compared to conventional boosting circuits by an output stage of push-pull structure, so the frequency characteristics become excellent compared to the conventional circuits.

Figure 4:
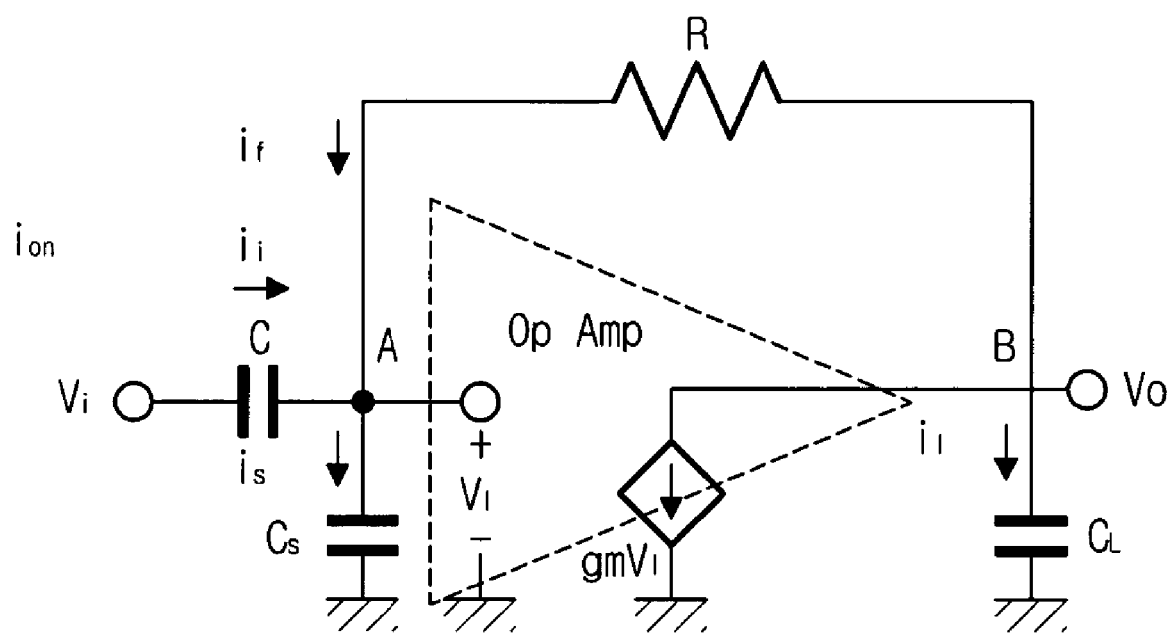
FIG. 4 is a view for showing an equivalent circuit of an input circuit of FIG. 3.

FIG. 4 is a view for showing an equivalent circuit of the input circuit parts 100a and 100b of FIG. 3. In here, $C_S$ and $C_L$ are parasitic capacitance in the input and output stages, respectively, and output resistance components of the differential amplifier are ignored. In such a circuit, currents at a first node A and a second node B can be expressed in Equation 3 as follows:

$$sC(v_i = v_l) + \frac{v_o - v_l}{R} = sC_s v_l \qquad [\text{Equation 3}]$$

$$\frac{v_o - v_l}{R} + sC_L v_o + g_m v_l = 0$$

Moreover, currents at respective parts of the circuit can be expressed in Equation 4 as follows:

$$i_i = sC(v_i = v_l) \qquad [\text{Equation 4}]$$

$$i_f = \frac{v_i - v_l}{R}$$

-continued $$i_s = sC_s v_l$$

$$i_L = sC_L v_o$$

If $C \gg C_s$, $C_L$, the relationship between the input voltages $V_i$ and $V_l$ can be expressed in Equation 5 as follows:

$$v_l = \frac{1}{g_m} \frac{sC(sRC_L+1)}{C_L C \frac{R}{g_m} s^2 + \frac{C}{g_m} s + 1} v_i \quad [\text{Equation 5}]$$

Accordingly, currents of a current source of the differential amplifier can be expressed in Equation 6 as follows:

$$g_m v_l = \frac{sC(sRC_L+1)}{C_L C \frac{R}{g_m} s^2 + \frac{C}{g_m} s + 1} v_i \quad [\text{Equation 6}]$$

The natural frequency and the damping ratio can be expressed in Equation 7 below from the quadratic expression in the denominator in Equation 6.

$$w_n = \sqrt{\frac{g_m}{RC_L C}} \quad [\text{Equation 7}]$$

$$\xi = \sqrt{\frac{C}{Rg_m C_L}}$$

Since $RC_L \ll C/g_m$ in general, poles rather than zeros due to $RC_L$ are located at low frequencies. Accordingly, the current from the current source of the operational amplifier has a differentiation relationship of Equation 8 as follows with respect to an input voltage signal up to a certain frequency range($\ll w_n$).

$$g_m v_l = sCv_i \quad [\text{Equation 8}]$$

Since a differential output current has a second order pole with respect to an input voltage, the damping ratio can be adjusted by a feedback resistor R. That is, a differentiation region can be expanded up to a certain frequency range by the feedback resistor R to maintain a phase of 90°.

The input circuit part 100a of FIG. 3 can be obtained when a differentiation circuit of a single stage differential amplifier is constructed by using such relationship.

Figure 5A:
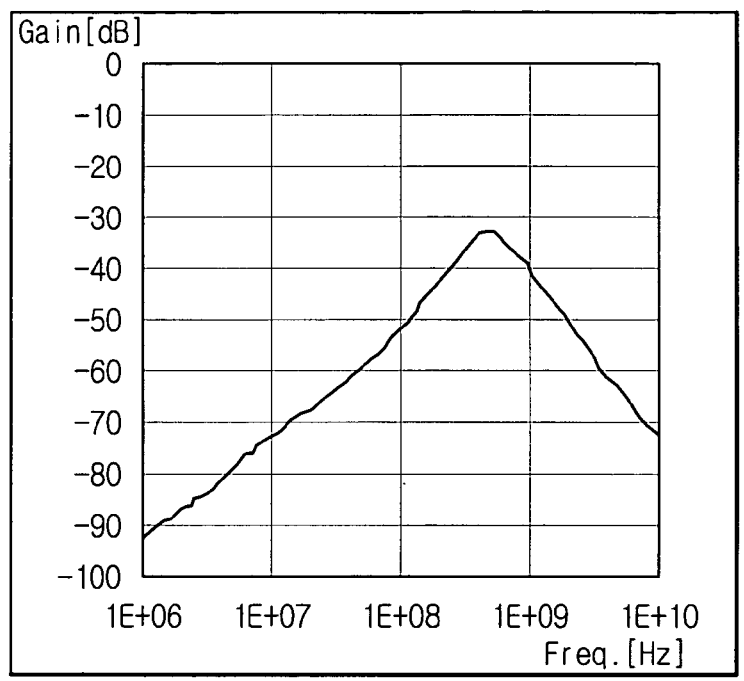
FIG. 5A and FIG. 5B are graphs for showing frequency characteristics of output currents in a boosting circuit according to an embodiment of the present invention.
Figure 5B:
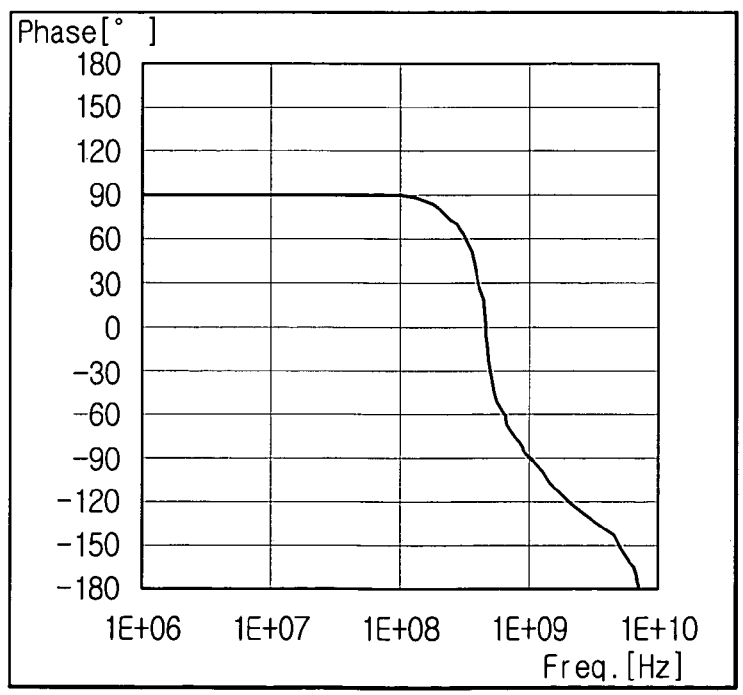

Meanwhile, FIG. 5A and FIG. 5B show results of the experiments measuring frequency characteristics of an output current for the boosting circuit of FIG. 3, wherein FIG. 5A shows magnitude characteristics and FIG. 5B shows phase characteristics. FIG. 5B shows that the boosting circuit has the phase characteristics maintaining +90° up to about 100 MHz, so good differentiation characteristics can be obtained.

Figure 6A:
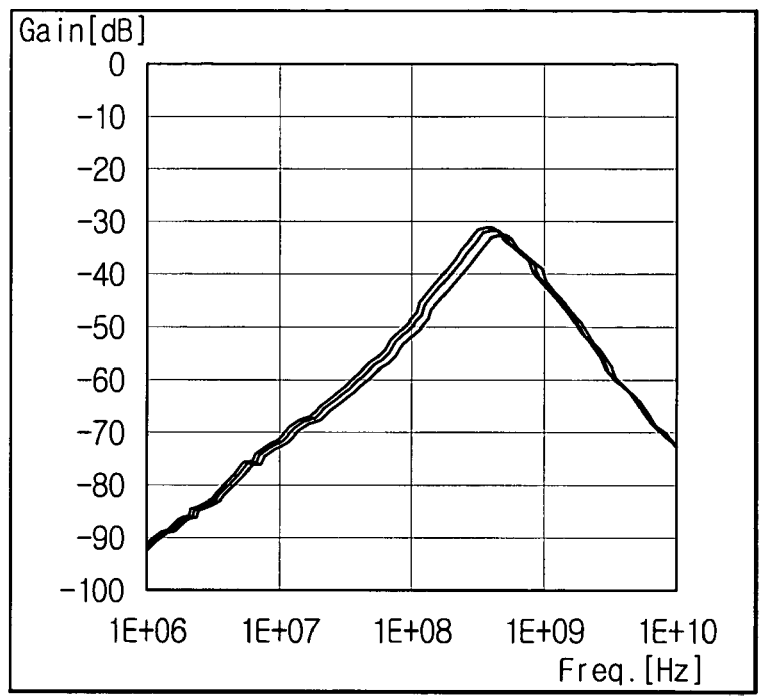
FIG. 6A and FIG. 6B are graphs for showing frequency characteristics based on magnitudes of feedback resistors.
Figure 6B:
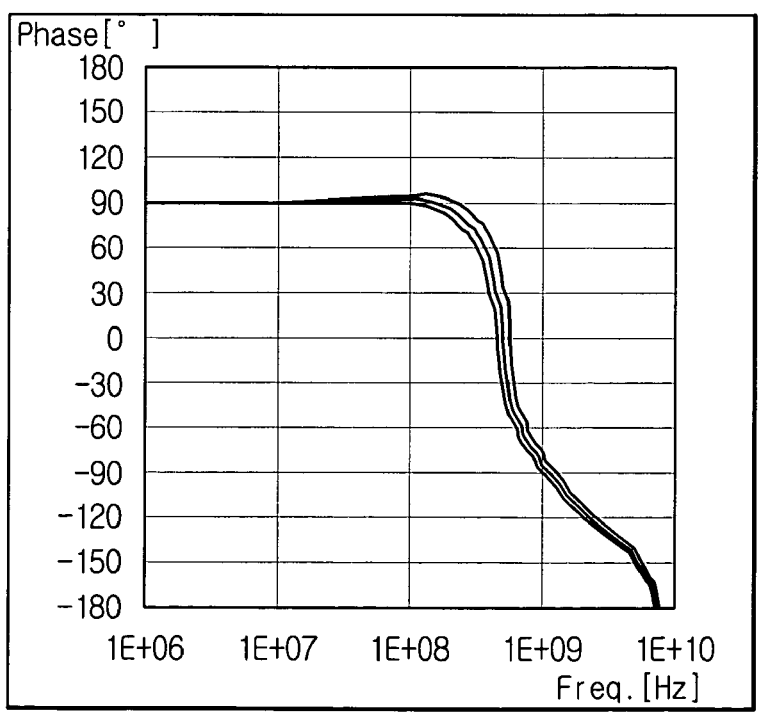

FIG. 6A and FIG. 6B show frequency characteristics variations according to changes of the first and second resistors R11 and R12 that are feedback resistors of FIG. 3. As shown, it can be seen that the use of the first and second resistors R11 and R12 facilitates phase adjustments in the operation range.

As described above, the boosting circuit has a broad maximum differentiable frequency bandwidth, facilitates the adjustments of differentiation characteristics, and has an effect that a differential output current is not affected by external factors such as voltages, processes, temperatures, and so on.

As aforementioned, the present invention provides a boosting circuit that has a broad maximum differentiable frequency bandwidth, facilitates the adjustments of differentiation characteristics of an output current, and has an effect in that an amount of output current of differentiation form is not affected by external factors such as voltages, processes, temperatures, and so on.

Such a boosting circuit can be used as a boosting circuit for equalizers used in optical recording/reproducing devices such as CD, DVD, and the like, or hard disc drives.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. A boosting circuit, comprising:
    an input circuit part for outputting a differential current proportional to differentiations of input voltages;
    a bias circuit part for mirroring the differential current, inverting the differential current, and producing an inverted differential current; and
    an output circuit part for adjusting each magnitude of the differential current and the inverted differential current based on a predetermined ratio size of MOS transistors of the output circuit part, to output an adjusted differential current and an adjusted inverted differential current, adding the adjusted differential current and the adjusted inverted differential current, and producing an output current in a push-pull form;
    wherein the input circuit part includes:
    a first differentiation circuit for being inputted with a reference voltage and a first input voltage of the input voltages, and outputting a first differential current;
    a second differentiation circuit for being inputted with the reference voltage and a second input voltage of the input voltages, and outputting a second differential current; and
    a current mirror circuit for mirroring the first and second differential currents.

2. The boosting circuit as claimed in claim 1, wherein the first and second differentiation circuits each has respective fully differential operational amplifier, capacitors, and resistors.

3. The boosting circuit as claimed in claim 2, wherein the fully differential operational amplifier has input terminals formed with NPN bipolar transistors in a left to right symmetry.

4. The boosting circuit as claimed in claim 2, wherein the bias circuit part mirrors the first differential current and produces a first inverted differential current wherein the first differential current is inverted, and mirrors the second differential current and produces a second inverted differential current wherein the second differential current is inverted.

5. The boosting circuit as claimed in claim 4, wherein the output circuit part includes:
    a first output part for adjusting each magnitude of the first differential current and the second inverted differential current based on the predetermined size ratio of a first MOS transistor and adding the adjusted magnitudes of the first differential current and the second inverted differential current, thereby outputting a first output current; and a second output part for adjusting each magnitude of the second differential current and the first inverted differential current based on the predetermined size ratio of a second MOS transistor and adding the adjusted magnitudes of the second differential current and the first inverting differential current, thereby outputting a second output current, and the output current being produced by adding the first and second output currents.

* * * * *